United States Patent
Lee

(10) Patent No.: US 9,455,041 B2
(45) Date of Patent: Sep. 27, 2016

(54) METHOD AND DEVICE FOR PROTECTING DATA OF FLASH MEMORY

(71) Applicant: Samsung Electronics Co., Ltd., Suwon-si (KR)

(72) Inventor: Kwang-sun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 3 days.

(21) Appl. No.: 14/319,204

(22) Filed: Jun. 30, 2014

(65) Prior Publication Data

US 2015/0131377 A1    May 14, 2015

(30) Foreign Application Priority Data

Nov. 11, 2013    (KR) .................. 10-2013-0136372

(51) Int. Cl.
*G11C 16/22* (2006.01)
*G11C 16/30* (2006.01)
*G06F 3/06* (2006.01)
*G06F 1/30* (2006.01)

(52) U.S. Cl.
CPC .............. *G11C 16/225* (2013.01); *G06F 1/30* (2013.01); *G06F 3/06* (2013.01); *G11C 16/30* (2013.01)

(58) Field of Classification Search
CPC ........................ G11C 16/225; G11C 16/30
USPC ...................................... 365/185.04
See application file for complete search history.

(56) References Cited

U.S. PATENT DOCUMENTS

| | | |
|---|---|---|
| 2002/0166009 A1 | 11/2002 | Lin |
| 2005/0099873 A1* | 5/2005 | Yoshida ............ 365/226 |
| 2010/0265785 A1 | 10/2010 | Lee et al. |
| 2010/0332862 A1 | 12/2010 | Lester et al. |
| 2011/0113212 A1 | 5/2011 | Chi et al. |
| 2013/0067154 A1 | 3/2013 | Deng et al. |
| 2015/0043280 A1* | 2/2015 | Pao ................ 365/185.18 |

OTHER PUBLICATIONS

Micron 256K×8 Boot Block Flash Memory Datasheet, pp. 1 and 26, Publication Date Feb. 1999 (.pdf file attached).*
Search Report dated Oct. 22, 2014 issued by the International Searching Authority in counterpart International Patent Application No. PCT/KR2014/004861 (PCT/ISA/210).

* cited by examiner

*Primary Examiner* — Hoai V Ho
*Assistant Examiner* — Tri Hoang
(74) *Attorney, Agent, or Firm* — Sughrue Mion, PLLC

(57) ABSTRACT

A method of protecting data of a flash memory is provided. The method includes detecting primary power applied to the flash memory, and applying secondary power converted from the primary power to the flash memory. The primary power is compared to first and second values, and a writing-protection pin of the flash memory is enabled when the detected primary power reaches a predetermined value.

22 Claims, 5 Drawing Sheets

METHOD AND DEVICE FOR PROTECTING DATA OF FLASH MEMORY

CROSS-REFERENCE TO RELATED APPLICATION

This application claims priority from Korean Patent Application No. 10-2013-0136372, filed on Nov. 11, 2013 in the Korean Intellectual Property Office, the disclosure of which is incorporated herein by reference in its entirety.

BACKGROUND

1. Field

Apparatuses and methods consistent with the exemplary embodiments relate to a method and device for protecting data of a flash memory, and more particularly to a method and device for protecting data of a flash memory, which can prevent data from being changed or deleted while an apparatus including the flash memory is powered on or off.

2. Description of the Related Art

Electronic appliances have employed a flash memory. The flash memory has been widely used in portable electronic appliances since it can maintain data even when the appliance is powered off. The flash memory includes a writing-protection pin so that its data can be protected.

FIG. 5 is a view illustrating a related art flash memory 12 supplied with power and controlled by a controller 14. A primary direct current (DC) power supply of about 12V is applied to the flash memory 12. This primary power is converted into about 3.3V DC through a DC/DC converter 11 and then applied to the power input terminals VCC of the flash memory 12 and the controller 14. The controller 14 applies a control signal to the writing-protection pin WP of the flash memory 12 through a general purpose input/output (GPIO) terminal, thereby enabling or disabling the writing-protection pin WP of the flash memory 12.

Accordingly, the writing-protection pin WR of the flash memory 12 is controlled by the controller 14 such as a micro processing unit (MCU) or a central processing unit (CPU), while stably maintaining the power constant, so that the data of the flash memory 12 can be stably protected.

However, when the electronic appliance including the flash memory 12 is powered on or off, the data stored in the flash memory 12 may be corrupted. Accordingly, a method for protecting the data of the flash memory 12 is required when the electronic appliance is powered on or off.

SUMMARY

One or more exemplary embodiments may provide a method and device for protecting data of a flash memory, which can stably protect the data of the flash memory when an apparatus including the flash memory is powered on or off.

According to an aspect of an exemplary embodiment, there is provided a method of protecting data of a flash memory, the method including detecting primary power applied to the flash memory; applying secondary power converted from the primary power to the flash memory; and enabling a writing-protection pin of the flash memory when the detected primary power reaches a predetermined value.

The writing-protection pin may be enabled when the primary power increases.

The writing-protection pin may be enabled before the secondary power is applied to the flash memory.

The writing-protection pin may be enabled when the primary power decreases.

The writing-protection pin may be enabled before the secondary power applied to the flash memory decreases.

According to an aspect of another exemplary embodiment, there is provided a device for protecting data of a flash memory, the device comprising, a power supply configured to supply primary power to the flash memory; a converter configured to apply secondary power converted from the primary power to the flash memory; and a writing-protection pin enabler configured to enable a writing-protection pin of the flash memory when the primary power reaches a predetermined value.

The writing-protection pin may be enabled when the primary power increases.

The writing-protection pin may be enabled before the secondary power is applied to the flash memory.

The writing-protection pin may be enabled when the primary power decreases.

The writing-protection pin may be enabled before the secondary power applied to the flash memory decreases.

According to an aspect of another exemplary embodiment, there is provided an apparatus including a flash memory, the apparatus including, a power supply configured to supply primary power to the flash memory; a converter configured to apply secondary power converted from the primary power to the flash memory; a controller configured to control the flash memory; and a writing-protection pin enabler configured to enable a writing-protection pin of the flash memory when the primary power reaches a predetermined value.

The writing-protection pin may be enabled when the primary power increases.

The writing-protection pin may be enabled before the secondary power is applied to the flash memory.

The writing-protection pin may be enabled when the primary power decreases.

The writing-protection pin may be enabled before the secondary power applied to the flash memory decreases.

The writing-protection pin enabler may include an analog-digital converter configured to convert the primary power into a digital value; a first comparator configured to compare the digital value with a first reference value; a second comparator configured to compare the digital value with a second reference value; an OR gate configured to receive an output from the second comparator and an control output from the controller; and a multiplexer configured to select one of an output from the first comparator and an output from the OR gate.

According to an aspect of another exemplary embodiment, there is provided a method of protecting data of a flash memory, the method including receiving, at the flash memory, a primary power from a power supply; converting the primary power to a secondary power; comparing the primary power to a first value; comparing the primary power to a second value, and enabling a writing-protection pin of the flash memory based on a result of the comparing of the primary power with the first value, and a result of the comparing of the primary power with the second value.

The writing-protection pin is enabled in response to the primary power being equal or greater than to the first value.

The writing-protection pin is enabled in response to the primary power being equal to or greater than the second value.

The comparing of the primary power to the first value is performed when the power supply is powered on.

The comparing of the primary power to the second value is performed when the power supply is powered off.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

Below, exemplary embodiments will be described in detail with reference to accompanying drawings. The following exemplary embodiments describe only configurations directly related to the application, and the descriptions of other configurations will be omitted. However, it will be understood that the omitted configurations are not unnecessary in realizing an apparatus or system to which the exemplary embodiments are applied. Further, like numerals refer to like elements throughout.

An exemplary embodiment may be applied to an apparatus including a flash memory 120. The apparatus with the flash memory 120 may for example include a set-top box, a digital camera, an MP3 player, a notebook computer, a smart phone, a personal digital assistant (PDA), etc. Hereinafter, a set-top box (STB) 100 of a television (TV) 200 will be described in detail as an example of the apparatus including the flash memory.

Figure 1:
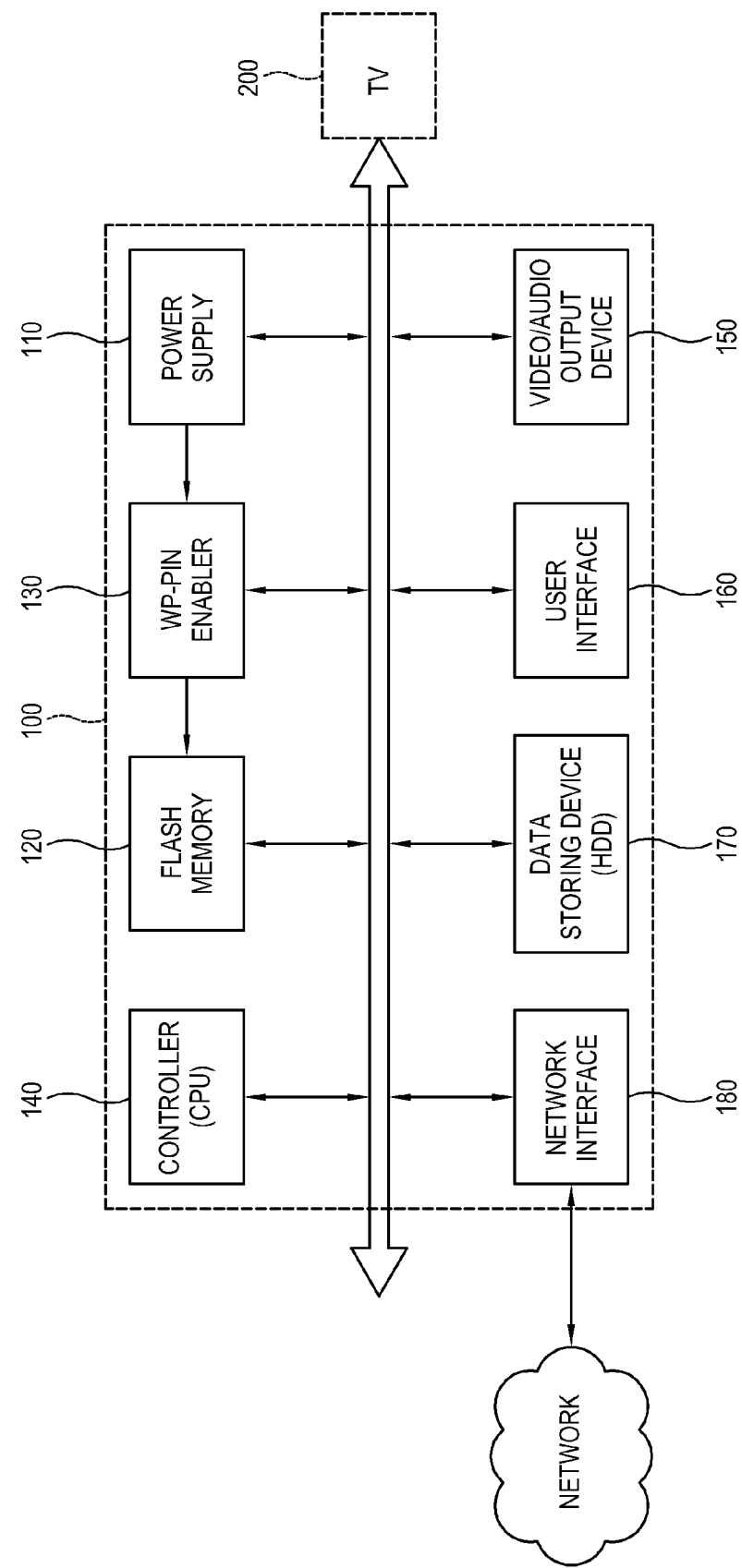
FIG. 1 is a block diagram schematically showing a set-top box including a flash memory according to an exemplary embodiment.
Figure 2:
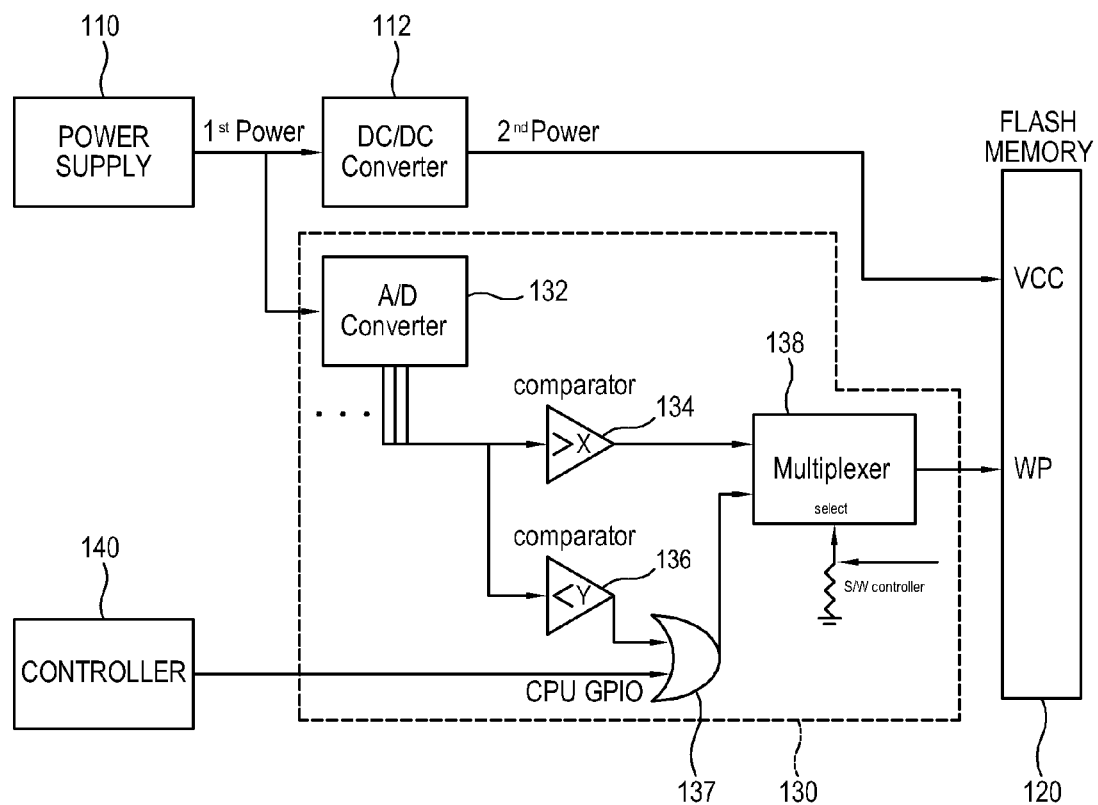
FIG. 2 is a circuit diagram showing a writing-protection pin enabler for protecting data of the flash memory according to an exemplary embodiment.

FIG. 1 schematically illustrates the set-top box 100 as one of an indoor receiver according to an exemplary embodiment, and FIG. 2 is a circuit diagram illustrating a writing-protection (WP) pin enabler 130 for protecting data of the flash memory 120 included in the set-top box 100 of FIG. 1.

As shown in FIG. 1, the set-top box 100 may include a power supply 110, a flash memory 120, a WP pin enabler 130 of the flash memory 120, a controller 140, a video/audio output device 150, a user interface 160, a data storing device 170, and a network interface 180. Of course, the set-top box 100 may further include an image processor (not shown), a graphic processor (not shown), a broadcasting receiver (not shown), etc. in addition to the foregoing elements, but detailed descriptions thereof will be omitted.

The power supply 110 may include an alternating current (AC)-direct current (DC) converter to convert an AC voltage of 110V or 220V received from the exterior into a DC voltage of about 12V and output it.

The flash memory 120 may include a NAND flash memory or a NOR flash memory. The flash memory 120 may for example store a downloaded control program of the controller 140. Of course, the flash memory 120 may store various data or programs besides the control program.

The WP pin enabler 130 enables a WP pin of the flash memory 120 when the power supply 110 is powered on or off, and protects the data stored in the flash memory 120. Detailed explanations about the WP pin enabler 130 will be described later.

The controller 140 controls general operations of the set-top box 100 in accordance with the control program stored in the flash memory 120. For example, the controller 140 may enable the WP pin to protect the data stored in the flash memory 120 or disable the WP pin to store new data in the flash memory 120. The controller 140 may include a central processing unit (CPU) or a micro processing unit (MPU).

The video/audio output device 150 outputs signals to be output through the TV 200 or a loudspeaker (not shown).

The user interface 160 may receive a control signal from a remote controller (not shown) or the like to allow a user to input his/her command. The user interface 160 collectively refers to a remote controller receiving section and a key input section, which generates key data when a user operates a corresponding key and outputs it to the controller 140.

The data storing device (e.g., a hard disk drive (HDD) 170 may have a large capacity, and may store various programs or data therein. The data storing device (i.e., HDD) 170 has a relatively slow processing speed as compared with the flash memory 120, a random access memory (RAM) and a read only memory (ROM).

The network interface 180 accesses a network through a physical transmission medium such as a phone line or an optical cable, and interfaces a transmitting/receiving signal.

Below, the WP pin enabler 130 according to an exemplary embodiment will be described in detail with reference to FIGS. 2 to 4.

As shown in FIG. 2, the WP pin enabler 130 may include an analog-digital (A/D) converter 132 configured to convert the primary power into a digital value; a first comparator 134 configured to compare the digital value with a first reference value "x"; a second comparator 136 configured to compare the digital value with a second reference value "y"; an OR gate 137 configured to receive an output from the second comparator and a control output from the controller 140; and a multiplexer 138 configured to select one of an output from the first comparator and an output from the OR gate 137.

The WP pin enabler 130 shown in FIG. 2 is just an example for explaining this exemplary embodiment. Since it is possible for a person having an ordinary skill in the art to manufacture the WP pin enabler in various forms while maintaining its function, the WP pin enabler 130 is not limited to only the circuit shown in FIG. 2.

Figure 4:
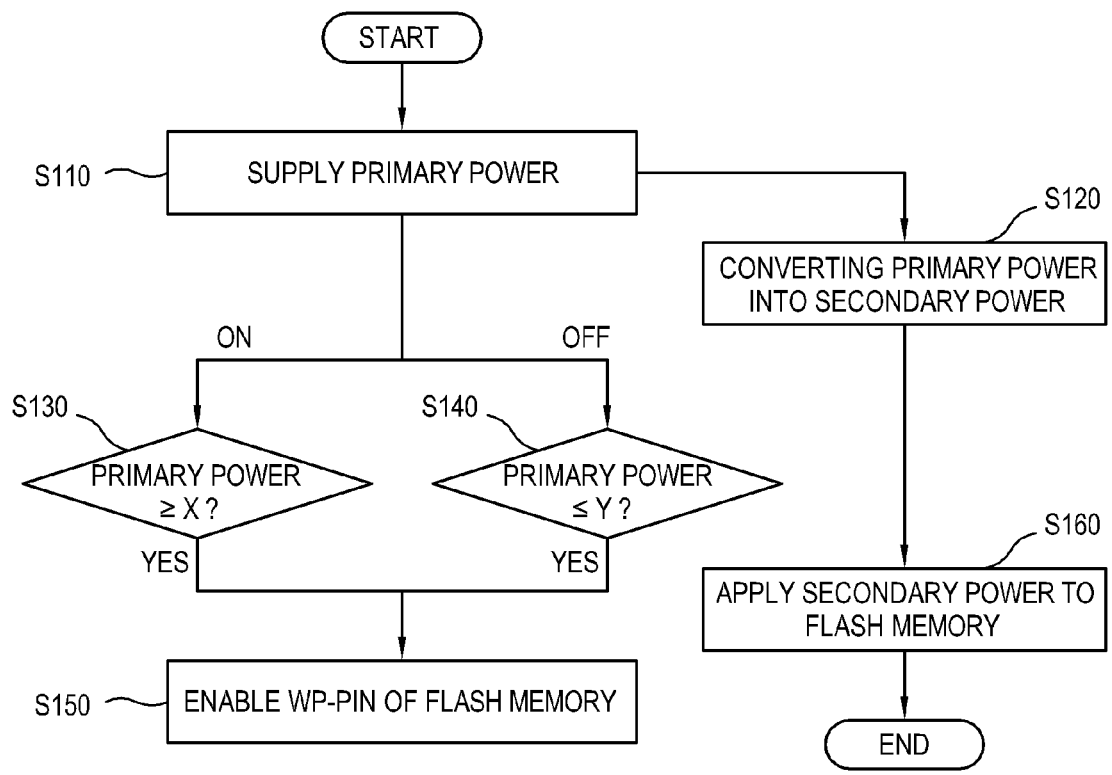
FIG. 4 is a flowchart showing a method of protecting data of the flash memory according to an exemplary embodiment.
Figure 5:
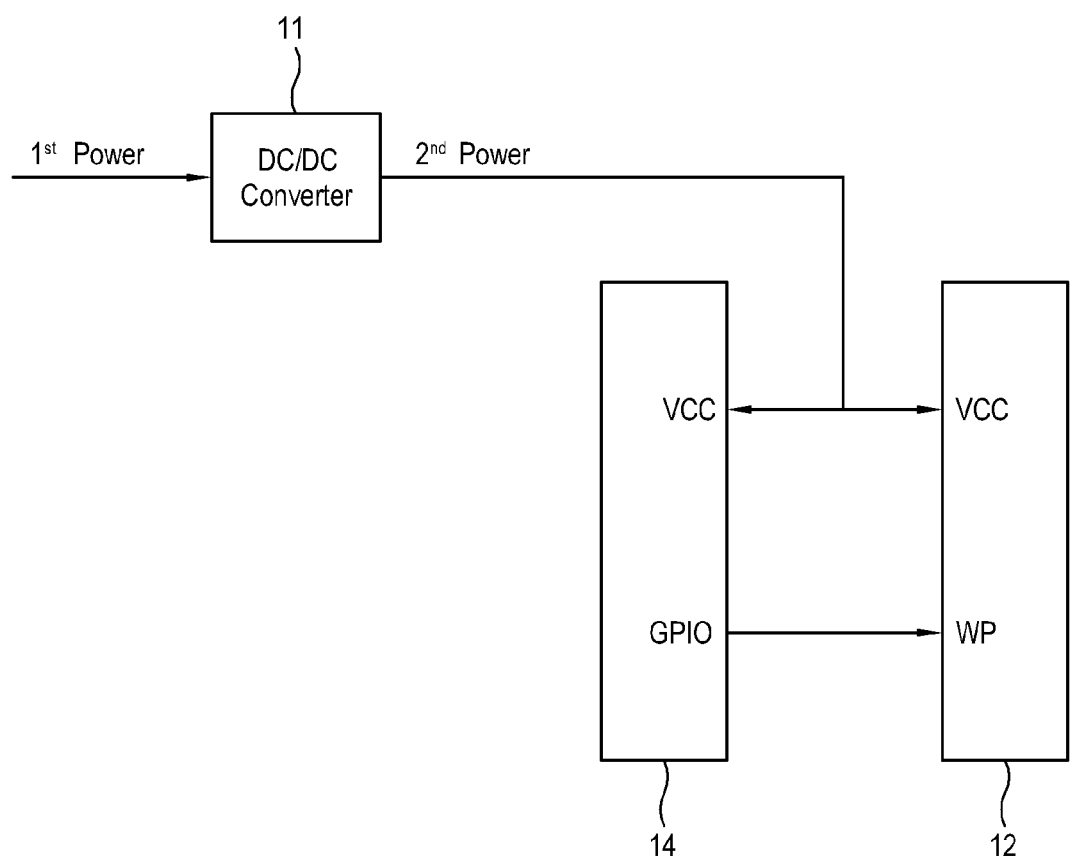
FIG. 5 is a block diagram illustrating a related art flash memory supplied with power and controlled by a controller.

Referring to FIG. 4, a process of controlling the flash memory 120 while being powered on or off is as follows.

At operation S110, the power supply 110 is powered on. The power supply 110 may, for example, supply a primary DC power of 12V.

At operation S120, the primary DC power of 12V is converted by a DC-DC converter 112. The primary power is converted into a secondary power in a time of about several tens of milliseconds (msec).

At operation S130, the WP pin enabler 130 detects the primary power while the primary power is converted into the secondary power, and compares the gradually increasing primary power with a predetermined value "x".

At operation S150, if the primary power reaches a predetermined value "x" as a result of the comparison in operation S130, the WP pin enabler 130 applies a "high" signal to the WP pin of the flash memory 120, thereby enabling the WP pin.

At operation S160, the secondary power is applied to the flash memory 120 in the state that the WP pin is enabled.

At operation S110, the power supply 110 is powered off, and thus the power supply 110 may for example, shut off the supplied primary DC power of 12V.

At operation S140, the WP pin enabler 130 detects the primary power while the primary power is converted into the secondary power, and compares the gradually decreasing primary power with a predetermined value "y".

At operation S150, if the primary power reaches a predetermined value "y" as a result of the comparison in operation S140, the WP pin enabler 130 applies a "high" signal to the WP pin of the flash memory 120, thereby enabling the WP pin.

At operation S160, the secondary power, which is applied to the flash memory 120 in the state that the WP pin is enabled, starts decreasing.

Below, the operations of the WP pin enabler 130 will be described in more detail with reference to FIG. 2.

Figure 3:
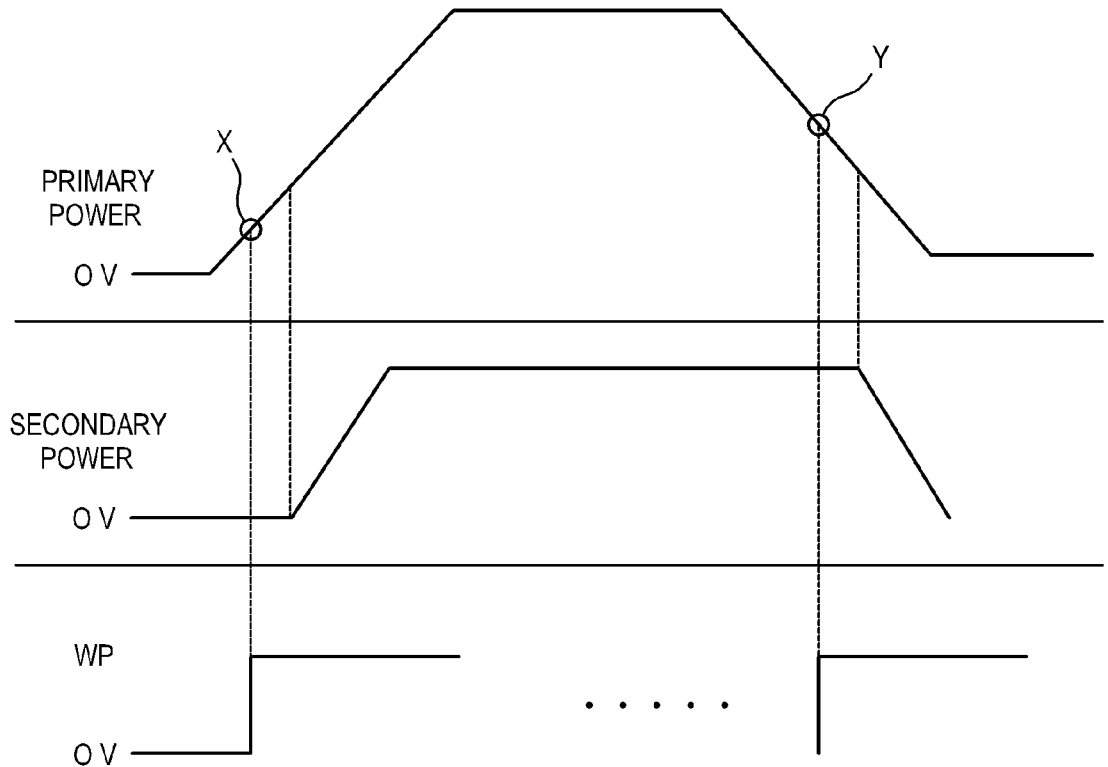
FIG. 3 illustrates waveforms showing timing for enabling a writing-protection pin of the flash memory according to an exemplary embodiment.

The power supply 110 supplies the primary DC power of 12V as shown in FIG. 3 when it is powered on. At this time, the primary power gradually increases and reaches a DC voltage of 12V. If the primary DC power of 12V is applied to the DC-DC converter 112, the secondary power also starts to gradually increase at the primary power of about 4V and reaches a DC voltage of 3.3V.

At the same time, the rising primary power of the power supply 110 is also supplied to the analog-digital converter 132 of the WP pin enabler 130. The analog-digital converter 132 converts the primary power input in an analog form into a digital value, and applies the digital value to the first comparator 134. That is, if the power supply 110 is powered on, the primary power gradually rises and the analog-digital converter 132 converts the gradually rising primary power into the digital value and supplies it to the first comparator 134. The first comparator 134 compares the digital value of the input primary power with a predetermined value "x". The first comparator 134 outputs a "high signal" to the multiplexer 138 when the primary power reaches the value "x".

The multiplexer 138 applies the output value of the first comparator 134 to the WP pin of the flash memory 120 and enables the WP pin to thereby prevent the flash memory 120 from writing data therein.

Here, the value "x" is varied depending on the performance of the DC-DC converter 112. For example, if the secondary power starts to be generated at the primary DC power of 4V input to the DC-DC converter 112, the value "x" has to be lower than at least DC 4V so as to enable the WP pin of the flash memory before the secondary power is substantially applied to the flash memory 120.

Thereafter, the primary DC power of 12V is always higher than the value "y" while being stably supplied, and therefore "low" is always input to the OR gate 137 connected to the output of the second comparator 136. Here, the value "y" is a value determined while the primary power drops from DC 12V to 0V, i.e., a value before the drop of the primary power causes the secondary power to drop.

Accordingly, while the primary DC power of 12V is supplied, the output of the OR gate 137 is varied depending on the input value of the OR gate 137 connected to a general purpose input/output (GPIO) terminal of the controller 140, and therefore the WP pin of the flash memory 120 can be controlled by the controller 140. Of course, the multiplexer 138 is controlled by software (S/W) to select one of the output of the first comparator 134 and the output of the OR gate 137.

If the power supply 110 is powered off, the primary power of DC 12V being stably supplied gradually drops and reaches 0V as shown in FIG. 3. The dropping primary power is applied to the DC-DC converter 112, the secondary power also starts to gradually drop at about DC 7V and reaches 0V.

At the same time, the decreasing primary power of the power supply 110 is also supplied to the analog-digital converter 132 of the WP pin enabler 130. The analog-digital converter 132 converts the primary power input in an analog form into a digital value and applies it to the first comparator 134. That is, when the power supply 110 is powered off, the primary power gradually decreases and the analog-digital converter 132 converts the gradually decreasing primary power into the digital value to thereby supply it to the second comparator 136. The second comparator 136 compares the digital value of the input primary power with a predetermined value "y". When the primary power reaches to the "y" value, the second comparator 136 outputs "high" to the multiplexer 138 via the OR gate 137.

The multiplexer 138 applies the output of the OR gate 137 to the WP pin of the flash memory 120 and enables the WP pin to thereby prevent the flash memory 120 from writing data therein.

Here, the value "y" is varied depending on the performance of the DC-DC converter 112. For example, if the secondary power starts to decrease at the primary DC power of 7V input to the DC-DC converter 112, the value "y" has to be higher than at least DC 7V so as to enable the WP pin of the flash memory before the secondary power to be applied to the flash memory 120 substantially decreases.

The foregoing values "x" and "y" are variable, and thus variously set up as necessary. This is because the values are determined in accordance with when the second power starts to be generated or decreases by the value of the primary power input to the DC-DC converter 112.

According to an exemplary embodiment, the writing-protection pin of the flash memory is enabled while an apparatus including the flash memory is powered on or off, thereby safely protecting data.

Although a few exemplary embodiments have been shown and described, it will be appreciated by those skilled in the art that changes may be made in these exemplary embodiments without departing from the principles and spirit of the inventive concept. Therefore, the foregoing has to be considered as illustrative only. The scope of the inventive concept is defined in the appended claims and their equivalents. Accordingly, all suitable modification and equivalents may fall within the scope of the claims.

What is claimed is:

1. A method of protecting data of a flash memory, the method comprising:
 detecting a primary power applied to the flash memory;
 applying a secondary power converted from the primary power to the flash memory; and
 enabling a writing-protection pin of the flash memory to prevent writing of new data in the flash memory in response to the detected primary power reaching a predetermined value while the primary power is increasing after turning on.

2. The method according to claim 1, wherein the writing-protection pin is enabled before the secondary power is applied to the flash memory.

3. The method according to claim 1, wherein the writing-protection pin is enabled in response to the primary power decreasing.

4. The method according to claim 1, wherein the writing-protection pin is enabled before the secondary power applied to the flash memory decreases.

5. A device for protecting data of a flash memory, the device comprising:
    a power supply configured to supply a primary power to the flash memory;
    a converter configured to apply a secondary power converted from the primary power to the flash memory; and
    a writing-protection pin enabler configured to enable a writing-protection pin of the flash memory to prevent writing of new data in the flash memory in response to the primary power reaching a predetermined value while the primary power is increasing after turning on.

6. The device according to claim 5, wherein the writing-protection pin is enabled before the secondary power is applied to the flash memory.

7. The device according to claim 5, wherein the writing-protection pin is enabled when the primary power decreases.

8. The device according to claim 5, wherein the writing-protection pin is enabled before the secondary power applied to the flash memory decreases.

9. An apparatus comprising a flash memory, the apparatus comprising:
    a power supply configured to supply a primary power to the flash memory;
    a converter configured to apply a secondary power converted from the primary power to the flash memory;
    a controller configured to control the flash memory; and
    a writing-protection pin enabler configured to enable a writing-protection pin of the flash memory to prevent writing of new data in the flash memory in response to the primary power reaching a predetermined value while the primary power is increasing after turning on.

10. The apparatus according to claim 9, wherein the writing-protection pin is enabled before the secondary power is applied to the flash memory.

11. The apparatus according to claim 9, wherein the writing-protection pin is enabled in response to the primary power decreasing.

12. The apparatus according to claim 9, wherein the writing-protection pin is enabled before the secondary power applied to the flash memory decreases.

13. An apparatus comprising a flash memory, the apparatus comprising:
    a power supply configured to supply a primary power to the flash memory;
    a converter configured to apply a secondary power converted from the primary power to the flash memory;
    a controller configured to control the flash memory; and
    a writing-protection pin enabler configured to enable a writing-protection pin of the flash memory in response to the primary power reaching a predetermined value, wherein the writing-protection pin enabler comprises:
    an analog-digital converter configured to convert the primary power into a digital value;
    a first comparator configured to compare the digital value with a first reference value;
    a second comparator configured to compare the digital value with a second reference value;
    an OR gate configured to receive an output from the second comparator and a control output from the controller; and
    a multiplexer configured to select one of an output from the first comparator and an output from the OR gate.

14. A method of protecting data of a flash memory, the method comprising:
    receiving, at the flash memory, a primary power from a power supply;
    converting the primary power to a secondary power;
    comparing the primary power to a first value;
    comparing the primary power to a second value, and
    enabling a writing-protection pin of the flash memory based on a result of the comparing of the primary power with the first value, and a result of the comparing of the primary power with the second value.

15. The method according to claim 14, wherein the writing-protection pin is enabled in response to the primary power being equal or greater than to the first value.

16. The method according to claim 14, wherein the writing-protection pin is enabled in response to the primary power being equal to or smaller than the second value.

17. The method according to claim 15, wherein the comparing of the primary power to the first value is performed when the power supply is powered on.

18. The method according to claim 16, wherein the comparing of the primary power to the second value is performed when the power supply is powered off.

19. The method according to claim 1, wherein the writing protection pin is enabled in response to the detected primary power reaching the predetermined value while an electronic device including the flash memory and a controller is being powered on and gradually increasing the power until the power becomes stable at a predetermined power level.

20. The method according to claim 1, wherein the primary power becomes stable when the primary power stays at about a predetermined power level.

21. The device according to claim 5, wherein the primary power becomes stable when the primary power stays at about a predetermined power level.

22. The apparatus according to claim 9, wherein the primary power becomes stable when the primary power stays at about a predetermined power level.

* * * * *